(12) United States Patent
Weier

(10) Patent No.: US 9,922,688 B2
(45) Date of Patent: Mar. 20, 2018

(54) BITLINE SENSING LATCH

(71) Applicant: Apple Inc., Cupertino, CA (US)

(72) Inventor: William R. Weier, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/242,734

(22) Filed: Aug. 22, 2016

(65) Prior Publication Data

US 2018/0053536 A1 Feb. 22, 2018

(51) Int. Cl.
*G11C 7/10* (2006.01)
*H01L 29/78* (2006.01)
*H03K 19/20* (2006.01)
*H03K 3/356* (2006.01)
*G11C 7/12* (2006.01)

(52) U.S. Cl.
CPC .............. *G11C 7/10* (2013.01); *G11C 7/12* (2013.01); *H01L 29/785* (2013.01); *H03K 3/356104* (2013.01); *H03K 19/20* (2013.01)

(58) Field of Classification Search
None
See application file for complete search history.

(56) References Cited

U.S. PATENT DOCUMENTS

| 6,594,190 B2 | 7/2003 | Yokozeki | |
|---|---|---|---|
| 6,597,612 B2 | 7/2003 | Yamauchi | |
| 7,369,450 B2 | 5/2008 | Choy | |
| 2010/0046280 A1* | 2/2010 | Chen | G11C 7/12 365/156 |
| 2012/0127782 A1* | 5/2012 | Moriwaki | G11C 7/18 365/154 |

\* cited by examiner

*Primary Examiner* — James G Norman
(74) *Attorney, Agent, or Firm* — Meyertons, Hood, Kivlin, Kowert & Goetzel, P.C.; Erik A. Heter

(57) ABSTRACT

A bit line sensing latch circuit is disclosed. In one embodiment, a latch circuit includes a keeper and a precharge circuit. The keeper may be implemented using a single pair of transistors that are cross-coupled between first and second differential signal nodes. A gate terminal of a first one of the pair of transistors is coupled to the first differential signal node, while the drain terminal of the same transistor is coupled to the second differential signal node. The gate terminal of a second one of the pair of transistors is coupled to the second differential signal node, while its drain terminal is coupled to the first differential signal node. The bitline sensing latch also includes a precharge circuit, and may operates in two phases, a precharge phase and an enable phase.

16 Claims, 5 Drawing Sheets

BITLINE SENSING LATCH

BACKGROUND

Technical Field

This disclosure is directed to electronic circuits, and more particularly, circuits for reading values stored in bit cells of a memory such as a register file.

Description of the Related Art

Many integrated circuits (ICs) implement on-chip memories, such as register files. Register files may provide memory close to various functional circuit blocks that need fast access thereto. For example, processor cores typically include register files to implement architected registers, as well as extra registers used in, e.g., register renaming schemes. Graphics processors may also implement register files near graphics processing cores.

A typical register file may include a number of bit cells, each arranged to store a single bit of information. The total number of bit cells in a register file may be divided into a number of subsets of bit cells. The bit cells of a given subset of bit cells may be coupled to a corresponding column decoder circuit that may select one bit cell of the subset during a read of data stored therein. The data in a selected bit cell may be output to a circuit that includes a dynamic sense amplifier and a latch circuit. Thus, a given data bit from a selected bit cell may be conveyed through a column decoder, a sense amplifier, and may be output via a latch circuit.

SUMMARY

A bit line sensing latch circuit is disclosed. In one embodiment, a latch circuit includes a keeper and a precharge circuit. The keeper may be implemented using a single pair of transistors that are cross-coupled between first and second differential signal nodes. A gate terminal of a first one of the pair of transistors is coupled to the first differential signal node, while the drain terminal of the same transistor is coupled to the second differential signal node. The gate terminal of a second one of the pair of transistors is coupled to the second differential signal node, while its drain terminal is coupled to the first differential signal node. The bitline sensing latch also includes a precharge circuit, and may operates in two phases, a precharge phase and an enable phase.

In one embodiment, the latch circuit is implemented without a corresponding sense amplifier. Thus, the keeper performs the sensing and storing function that would performed by a sense amplifier in prior art embodiments.

Control of the circuit may be accomplished using a single control signal. When the control signal is in a first state, the circuit may operate in the enable phase. When the control signal is in a second state, the circuit may operate in the precharge phase. When operating in the precharge phase, the precharge phase may pull both of the differential signal nodes to a voltage on a fixed voltage node.

In the enable phase, the keeper may drive the differential signal nodes to logic values complementary to one another, dependent on the values stored in a bit cell. The bit cell may be selected by a column decoder circuit. The logic values stored in a selected bit cell may be routed through the column decoder to the differential signal nodes of the latch circuit. An output circuit may provide an output value based on the values on the differential signal nodes. In one embodiment, the output circuit may provide the output value on a single-ended signal node.

BRIEF DESCRIPTION OF THE DRAWINGS

The following detailed description makes reference to the accompanying drawings, which are now briefly described.

Figure 1:
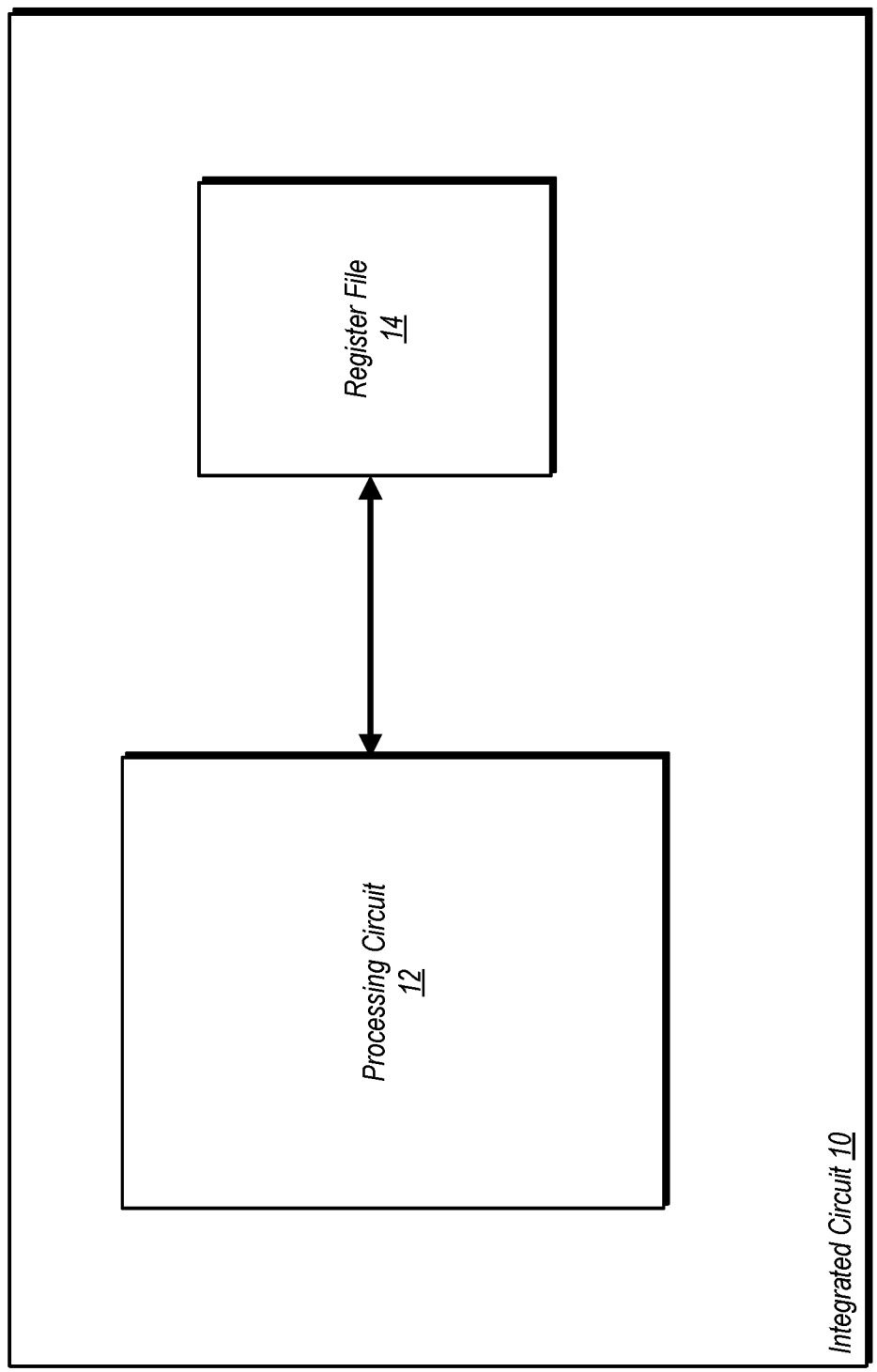
FIG. 1 is a block diagram of one embodiment of an integrated circuit (IC) having a register file.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element.

Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of an integrated circuit (IC) is shown. IC 10 as shown herein is a simplified example provided for the sake of illustration, but is not meant to be limiting to any particular IC embodiment.

As illustrated in FIG. 1, IC 10 includes a processing circuit 12, which is coupled to a register file 14. The processing circuit 12 may be one of a number of different types of processing circuits, including general purpose processing circuits, graphics processing circuits, digital signal processing circuits, and so forth. Register file 14 may be used to store information used by processing circuit 12 in performing operations (e.g., operands for particular instructions that are executed by one embodiment). Additionally, register file 14 may also store the results of operations performed by processing circuit 12.

Although not shown herein, IC 10 may also include various input/output (I/O) circuits for conveying information thereto and therefrom. For example, information from register file 14 may be conveyed, directly or indirectly, to another memory (e.g., a cache memory) in the system in which IC 10 is implemented. Similarly, register file 14 may receive information from sources external to IC 10, either directly or indirectly.

Figure 2:
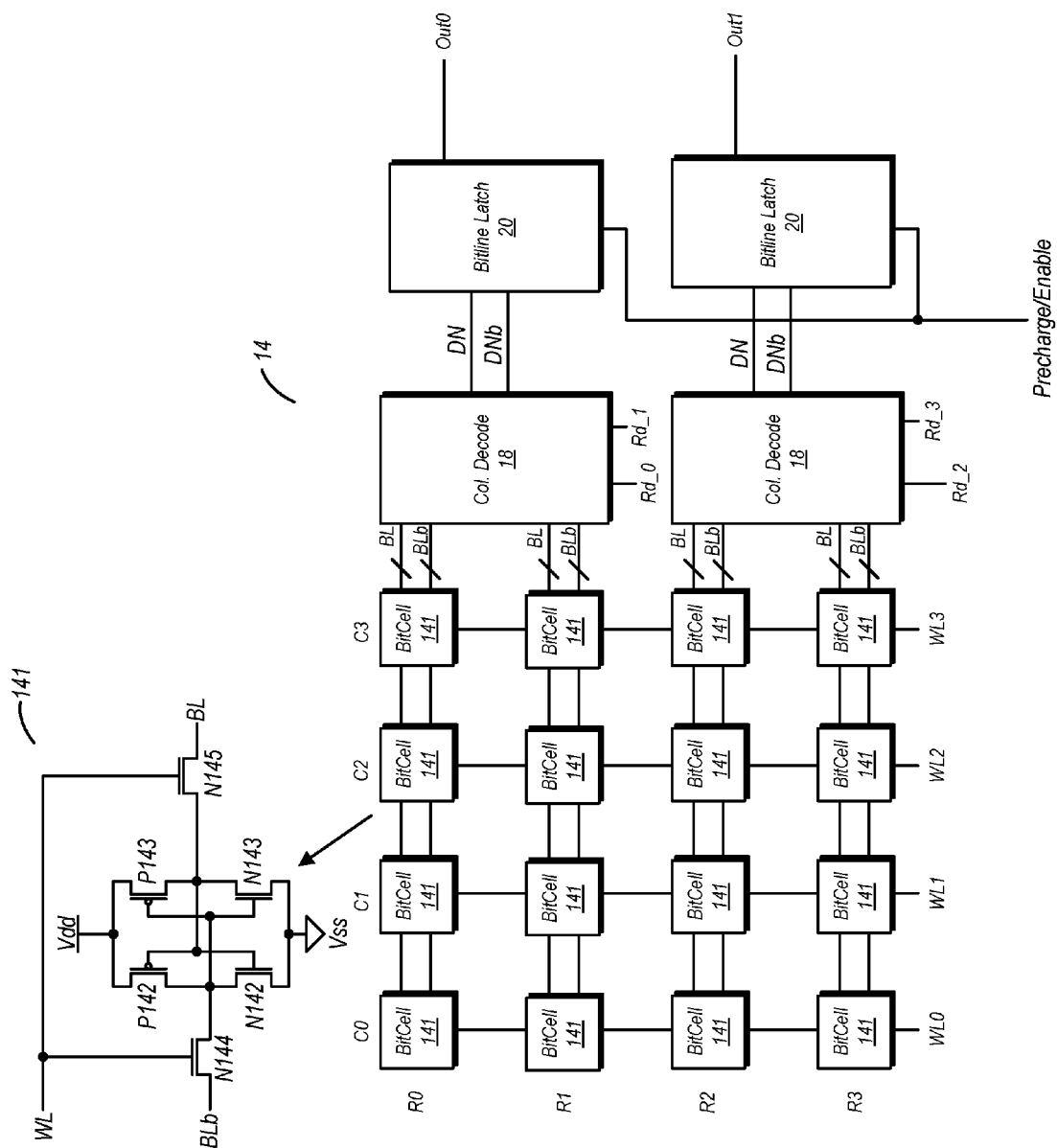
FIG. 2 is a block diagram of one embodiment of a register file.

FIG. 2 is a diagram illustrating one embodiment of a register file. As with FIG. 1, the embodiment of register file 14 shown in FIG. 2 is simplified for the sake of illustration. Embodiments having a different number of bitcells, rows, and/or columns are possible and contemplated, and thus FIG. 2 is not intended to be limiting.

In the illustrated embodiment, register file 14 includes a number of bitcells 141. Each of the bitcells in this embodiment is a six transistor, or 6 T, bit cell. A schematic diagram of an exemplary 6 T bit cells is also shown in FIG. 2. In the schematic diagram, passgate transistors N144 and N145, when activated, couple the internal portion of the cell to the complementary bit line (BLb) and the true bit line (BL), respectively. These passgate transistors may be activated for both write and read operations. Transistors P142, P143, N142, and N143 form two cross-coupled inverters that may hold both true and complementary logic values that have been written into the bitcell 141.

Although the embodiment discussed herein uses 6 T bitcells, embodiments that use other types of bitcells are also possible and contemplated.

The bitcells 141 in this exemplary embodiment are arranged into four rows (R0-R3) of four columns (C0-C3) each. The bit lines BL and BLb of each of the bitcells 141 are coupled to a corresponding column decoder circuit 18. Each of the bitcells 141 in a given column is coupled to receive a common word line signal (e.g., the bitcells 141 in C0 are each coupled to receive a word line signal WL0). When a word line signal is asserted, the passgates of the correspondingly coupled bitcells 141 are activated and thus the bitlines are coupled to the internal nodes defined by the cross-coupled inverters. During write operations, a given word line may be activated, and data may be conveyed into the internal nodes of the affected bitcells 141 through the passgate transistors. During read operations, a given word line may be activated and data stored in the affected bit cells may be conveyed onto the bit lines through the passgate transistors.

Each instance of a column decoder circuit 18 corresponds to a pair of bitcell rows in this embodiment and is configured to select a cell from one of the rows. During a read and write operations, a single one of the word lines may be activated to select each of the bitcells in the corresponding column. The remaining word lines may remain inactive. Each bitcell 141 in the selected column may convey data via its bitlines to the correspondingly coupled one of the column decoder circuits 18. Each column decoder 18 may select one of the bitcells 141. For example, the first (upper) column decoder circuit 18 may select a bitcell 141 in either Row 0 or Row 1 of the active column (by activating one of Rd_0 or Rd_1), while the second (lower) column decoder circuit 18 may select a bitcell 141 from either Row 2 or Row 3 of the active column (by activating one of Rd_2 or Rd_3). Thus, the column decoder circuit 18 shown in this embodiment are 2-1 decoders, although other types (e.g., 4-1, 8-1, etc.) are possible and contemplated. Each selected bitcell 141 may convey its stored data via the true and complementary bit lines to the corresponding bitline latch 20 via the associated differential signal nodes DN and DNb. Each bitline latch circuit 20 may provide an output bit as a single-ended signal. As explained in further detail below, one embodiment of the bitline latch 20 may be implemented without the use of a sense amplifier that is commonly used in corresponding circuits of prior art embodiments. This can result in significant area savings.

Figure 3:
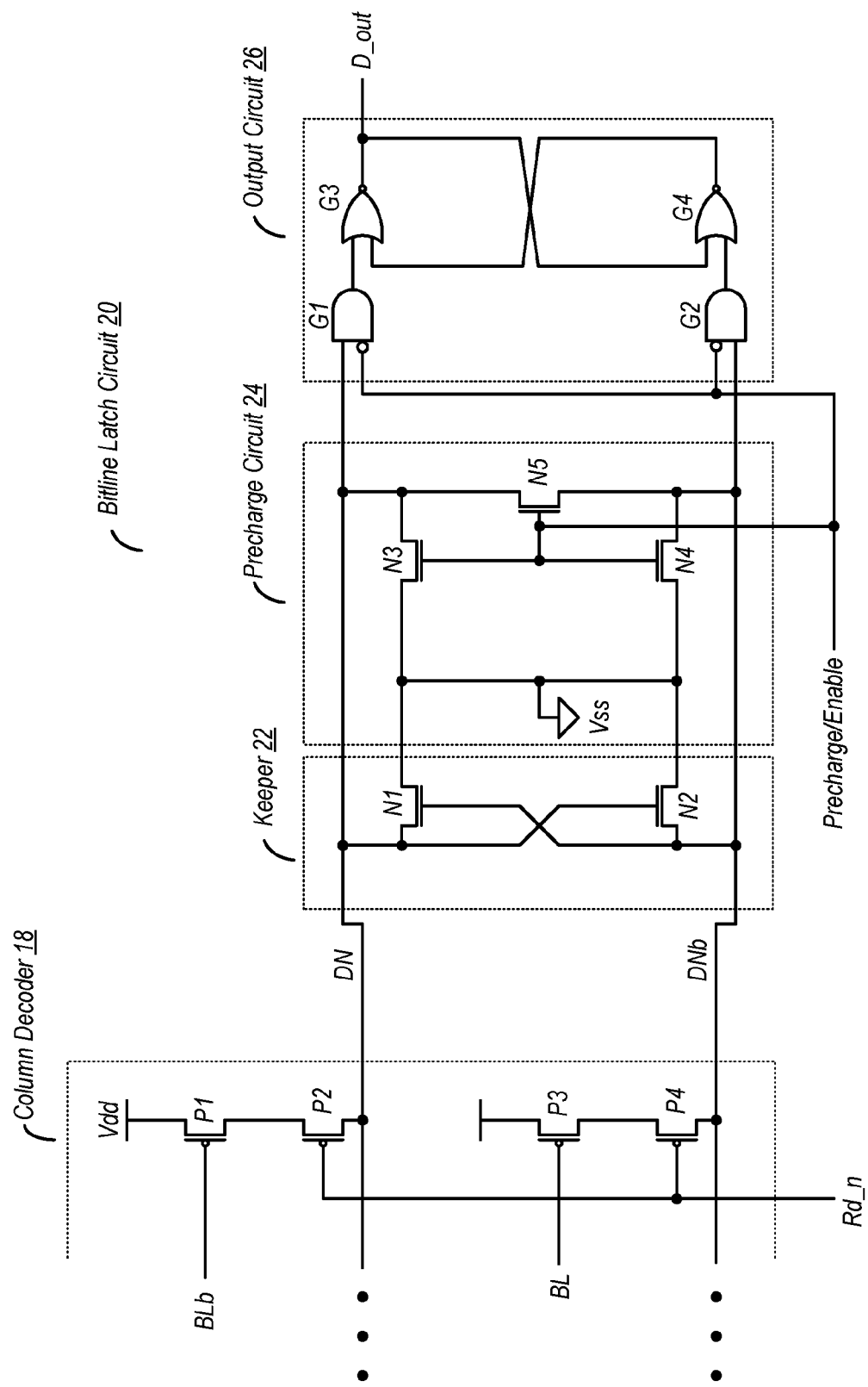
FIG. 3 is a schematic diagram of one embodiment of a circuit including a bit line latch.

Turning now to FIG. 3, one embodiment of a bitline latch circuit 20 is shown, along with a portion of a column decoder 18. Each bitcell 141 in a given row is coupled to a corresponding column decoder 18. For each bitcell 141 in the given row a pair of transistors are coupled to differential signal lines DN and DNb of bitline latch circuit 20. In this embodiment, the transistors are arranged in a pull-up stack and are implemented as PMOS (p-channel metal oxide semiconductor) devices. A first pull-up stack is implemented with transistors P1 and P2, while a second pull-up stack is implemented using transistors P3 and P4.

Using the example of FIG. 2, which two columns, a corresponding embodiment of a column decoder circuit 18 would include four pull-up stacks. In each pull-up stack, the gate terminal of one of the transistors is coupled to a bitline (BL or BLb) of a corresponding bitcell 141, while the gate terminal of the other transistor is coupled column select signal (Rd_n as shown here).

During a read operation, the read column signal corresponding to the active column is asserted (active low in this embodiment). One of the BL or BLb signals will be low based on the data stored in the selected bitcell 141. Accordingly, one of the pull-up stacks corresponding to the selected column will become active and pull up toward Vdd (e.g., the supply voltage node in this case) the corresponding differential signal node. For example, If BLb is low when the corresponding read column signal is active, the differential node DN is pulled up toward Vdd. The other differential signal node, DNb, remains low in this particular example due to a precharge operation and cross-coupled keeper as explained in further detail below.

Bitline latch circuit 20 in the embodiment shown can be divided into three basic components: a keeper 22, a precharge circuit 24, and an output circuit 26. Keeper 22 in the embodiment shown is implemented using only a single pair of NMOS (n-channel metal oxide semiconductor) transistors, N1 and N2. The gate terminal of N1 is coupled to differential node DNb, while the drain terminal of this device is coupled to differential node DN. Conversely, the gate terminal of N2 is coupled to differential node DN, while its drain terminal is coupled to DNb.

Bitline latch circuit 20 in the illustrated embodiment may operate in one of two different phases, or modes. The first phase is an enable phase, which may be operative during read operations. The second phase may be a precharge phase, which may be operative between read operations or when no read operation is otherwise in progress. When operating in the enable phase, the differential signal nodes DN and DNb are complementary to one another and dependent on the values stored in the selected bitcell 141. For example, if the selected bitcell 141 outputs a high on the true bitline (BL) and a low on the complementary bitline (BLb), the pull-up stack of P1 and P2 may pull differential node DN high, while DNb is low. These bitline values are conveyed to keeper 22. If the selected bitcell 141 outputs a low on the true bitline BL and a high on the complementary bitline BLb, differential node DN is pulled high and DNb is low.

When DN is pulled high, transistor N2 is activated as a result thereof. When N2 is active, a pulldown path between DNb and Vss (a reference voltage node) is created, and thus DNb is held low. When DNb is pulled high, transistor N1 is activated, thereby providing a pulldown path between DN and Vss. Thus, responsive to the operation of the activated pull up stack in column decoder 18, one of the differential signal nodes is pulled high, while the other is held low.

Operation in the precharge and enable phases may be effected based on the state of a control signal, labeled here as 'Precharge/Enable'. When the control signal is low in this embodiment, bitline latch circuit 20 operates in the enable phase. The values on the differential nodes are conveyed to the logic gates of output circuit 26, which forms a latch in this embodiment. AND gate G1 in this embodiment is coupled to receive a signal from differential node DN on a first one of its inputs. Similarly, AND gate G2 is coupled to receive a signal via differential node DNb on a first one of its inputs. The second input on both of these gates are active low inputs coupled to receive the control signal. Thus, when operating in the enable phase, one of G1 or G2 outputs a logic high depending on which of the differential signal nodes is carrying a logic high. The logic high is conveyed to a correspondingly coupled one of the cross-coupled NOR gates G3 and G4. The single-ended output of bitline latch circuit 20 is taken as the output of G3, and corresponds to the state of the values conveyed on the bitlines of the selected bitcell 141. If the selected bitcell 141 causes a high on differential node DN, a low is conveyed from D_out. If the selected bitcell 141 high to be conveyed on differential node DNb, a high is conveyed from D_out.

It is noted that while a single control signal is used to control the operational mode of the circuit shown in FIG. 3, embodiments are possible and contemplated in which separate control signals are used to control the mode. It is further noted that other embodiments of output circuit 26 that latch and store the selected bit cell are possible and contemplated, and thus the disclosure is not limited to the specific embodiment shown in FIG. 3.

Precharge circuit 24 in the embodiment shown includes three transistors, N3, N4, and N5. When the control signal is high, logic gates G1 and G2 each output a logic low. Since the gate terminals of N3, N4, and N5 are coupled to receive the control signal, the logic high state thereof activates these devices. When active, transistor N3 creates a pull-down path between DN and Vss, while the activated N4 creates a pull-down path between DNb and Vss. Meanwhile, the activation of N5 causes the respective voltages on DN and DNb to be substantially equalized with one another. Furthermore, since both DN and DNb are low during operation in the precharge phase, transistors N1 and N2 of keeper 22 are inactive.

Generally speaking, bitline latch circuit 20 may implement a simple circuit for capturing and conveying a value from a bitcell. Contrary to prior art embodiments, the circuitry shown herein may be implemented without the use of a dynamic sense amplifier. Therefore, the overall circuit may be significantly simpler than prior art embodiments that utilize a sense amplifier separate from a latch circuit. Furthermore, bitline latch circuit 20 may consume significantly less area than a prior art embodiment having a sense amplifier and a separate latch circuit. It is also noted that, during operation in the enable phase in various embodiments of the disclosed circuit, the voltages on the differential voltage nodes DN and DNb may undergo full rail separation (or near-full rail separation). This is in contrast to the operation of prior art sense amplifiers, in which the separation of the voltages on the differential nodes is not substantially full rail.

It is noted that in some embodiments, at least some of the transistors may be implemented using FinFETs (Fin field-effect transistors). The use of FinFETs for at least some of the transistors of bitline latch circuit 20 (as well as other circuits discussed herein) may allow for lower dynamic power consumption, and smaller area per transistor required to achieve a similar gain.

While the discussion of the circuitry above has referenced certain polarities of various devices, signals, and voltages, it is noted that these are exemplary and not intended to limit the scope of this disclosure to those embodiments alone. For example, embodiments in which a precharge circuit that pulls differential node up to logic high values instead of the logic low values discussed herein are possible and contemplated, among many other possible variations. Furthermore, while certain IC technologies have been discussed herein, the scope of this disclosure is not limited thereto. Accordingly, the disclosure contemplates the implementation of the various circuits described herein as being implemented in any suitable IC technology.

Figure 4:
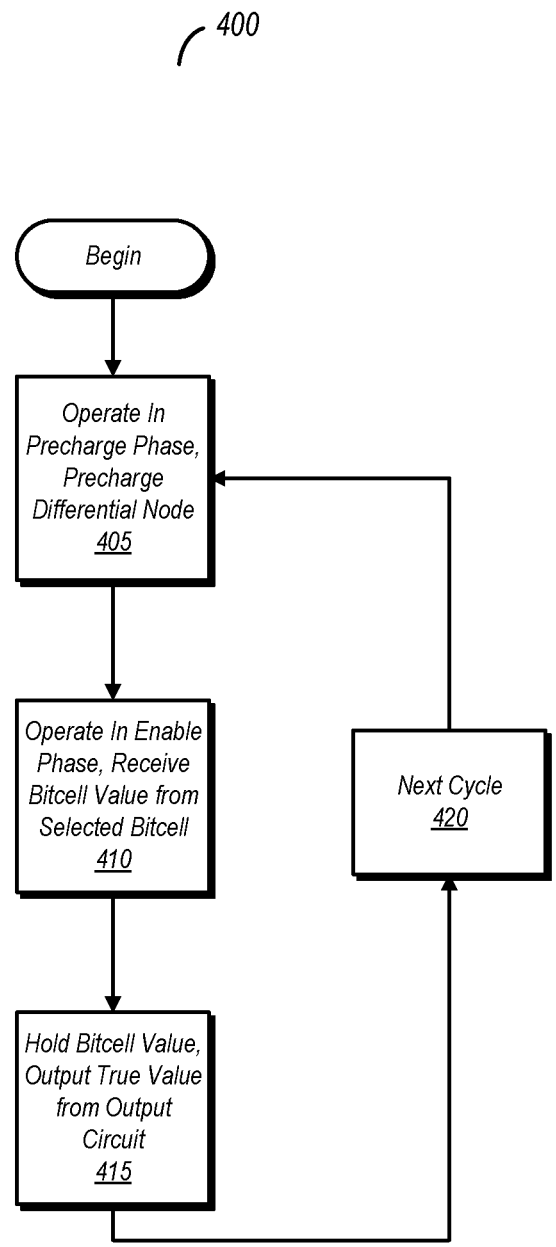
FIG. 4 is a flow diagram of one embodiment of a method for operating a bit line latch.

FIG. 4 is a flow diagram of one embodiment of a flow diagram for operating a bitline latch circuit. Method 400 as described herein may be implemented using any of the various circuit embodiments discussed above, as well as those not explicitly discussed herein. In general, method 400 may be performed with any circuitry capable of performing the various method steps described herein, using any contemplated circuit topology and IC technology.

Method 400 begins with operation in the precharge phase, and the precharging of the differential voltage nodes (block 405). The precharging may be performed by electrically coupling the differential nodes of the circuit to a fixed voltage node (e.g., Vdd or Vss). Operation in the precharge phase may be effected by providing a control signal to the circuit in a first state.

When the control signal is provided to the circuit in a second state, operation in the enable phase may initiated (block 410). Upon initiation of operation in the enable phase, a bitcell value may be received from a selected bitcell, via a column decoder circuit. A keeper in the circuit may capture a value dependent on the value received from the bitcell via the column decoder. The value may be held by the keeper, while an output circuit provides an output value dependent on that held by the keeper (block 415). Thereafter, operation may progress to the next cycle (block 420), and thus return to operation in the precharge phase per block 405.

Figure 5:
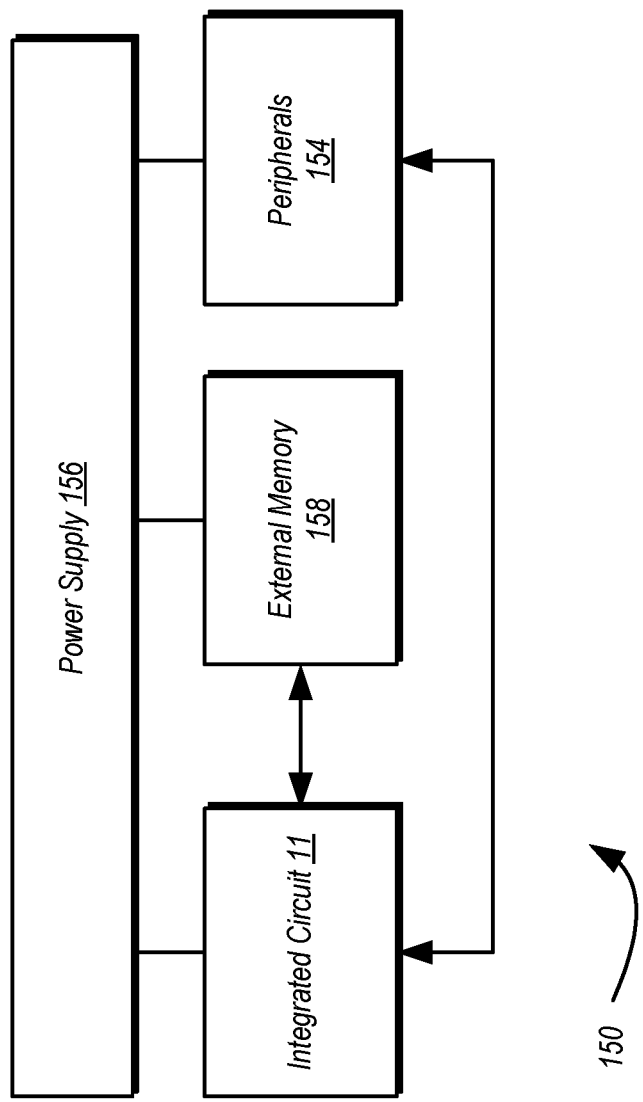
FIG. 5 is a block diagram of one embodiment of an exemplary system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

The invention claimed is:

1. A circuit comprising:
a latch circuit configured to operate in one of precharge phase or an enable phase, the latch circuit being coupled to a column decoder and including:
a keeper circuit implemented using a single pair of transistors including a first transistor having a gate terminal coupled to a first differential signal node and a second transistor having a gate terminal coupled to a second differential signal node, the first and second transistors being arranged in a cross-coupled configuration, and wherein, during the enable phase, the keeper is configured to cause the first and second differential signal nodes to convey logic values complementary to one another based on data received by the latch circuit;
a precharge circuit configured to, during a precharge phase, precharge the first and second differential signal nodes; and
an output circuit configured to, in the enable phase, generate an output signal based on a differential value generated by the keeper during the enable phase;
wherein the latch circuit is coupled to receive a control signal that, when in a first state, causes the precharge circuit to precharge the first and second differential nodes, and in a second state, cause the output circuit to provide the output signal; and
wherein the output circuit comprises first and second cross-coupled NOR gates, a first AND gate having an output coupled to a first input of the first NOR gate and a second AND gate having an output coupled to a first input of the second NOR gate, wherein a first input of the first AND gate is coupled to the first differential signal node, wherein a first input of the second AND gate is coupled to the second differential signal node, and wherein respective second inputs of each of the first and second AND gates are coupled to receive the control signal.

2. The circuit as recited in claim 1, wherein a drain terminal of each of the first and second transistors are coupled to the second and first differential signal nodes, respectively.

3. The circuit as recited in claim 1, further comprising a column decoder configured to couple true and complementary bit lines of a selected one of a first plurality of bit cells to the first and second differential signal nodes, respectively.

4. The circuit as recited in claim 3, wherein, during the enable phase, the keeper is configured to generate logic values on the first and second differential signal nodes based on respective logic values present on the true and complementary bit lines of the selected one of the first plurality of bit cells.

5. The circuit as recited in claim 1, wherein the precharge circuit includes a third transistor coupled between the first differential signal node and a first fixed voltage node, a fourth transistor coupled between the second differential signal node and the first fixed voltage node, and a fifth transistor coupled between the first and second differential signal nodes and configured to, when active, equalize a voltage on the first differential signal node to that of the second differential signal node, and wherein one or more of the first, second, third, fourth, and fifth transistors are implemented using FinFETs (Fin field effect transistors).

6. The circuit as recited in claim 1, wherein the circuit does not include a sense amplifier.

7. A method comprising:
operating a latch circuit in a precharge phase responsive to receiving a control signal in a first state, wherein operation in the precharge phase includes a precharge circuit driving first and second differential signal nodes to a voltage on a fixed voltage node;
operating the latch circuit in an enable phase responsive to receiving the control signal in a second state, wherein operating in the enable phase includes the latch circuit receiving first and second logic values that are complementary to one another on the first and second differential signal nodes, respectively;
a keeper circuit driving and holding the first and second differential signal nodes to the first and second logic values during operation in the enable phase, wherein the keeper is implemented using a single pair of cross-coupled transistors including a first transistor having a gate terminal coupled to the first differential signal node and a drain terminal coupled to the second differential signal node, wherein the latch circuit includes the keeper circuit; and
an output circuit outputting an output signal dependent on the logic values present on the first and second differential signal nodes during operation in the enable phase, wherein the output circuit comprises first and second cross-coupled NOR gates, a first AND gate having an output coupled to a first input of the first NOR gate and a second AND gate having an output coupled to a first input of the second NOR gate, wherein a first input of the first AND gate is coupled to the first differential signal node, wherein a first input of the second AND gate is coupled to the second differential signal node, and wherein respective second inputs of each of the first and second AND gates are coupled to receive the control signal.

8. The method as recited in claim 7, further comprising, during operation in the enable phase:
a column decoder circuit selecting one of a plurality of bit cells; and
conveying, from bit lines of the selected one of the plurality of bit cells, logic values present on the first and second differential signal nodes to the latch circuit.

9. The method as recited in claim 7, further comprising: the output circuit inhibiting the logic values present on the first and second differential signal nodes during operation in the precharge phase.

10. The method as recited in claim 7, further comprising, during operation in the precharge phase:
third and fourth transistors pulling voltages on the first and second differential signal nodes toward a voltage present on a fixed voltage node; and
a fifth transistor activating to equalize a voltage on the first differential signal node to that of the second differential signal node.

11. The method as recited in claim 7, further comprising: operating the latch circuit in the enable phase responsive to receiving a control signal in a first state; and
operating the latch circuit in the precharge phase responsive to receiving the control signal in a second state.

12. A register file comprising:
a plurality of bit cells;
a plurality of column decoder circuits each coupled to a corresponding subset of the plurality of bit cells;
a plurality of latch circuits each coupled to a corresponding one of the plurality of column decoder circuits, each of the latch circuits including:
a keeper circuit implemented using a single pair of transistors including a first transistor having a gate terminal coupled to a first differential signal node and a second transistor having a gate terminal coupled to a second differential signal node, the first and second transistors being arranged in a cross-coupled configuration, and wherein, during the enable phase, the keeper is configured to cause the first and second differential signal nodes to convey logic values complementary to one another based on data received by the latch circuit from its correspondingly coupled one of the plurality of column decoder circuits;
a precharge circuit configured to, during a precharge phase, precharge the first and second differential signal nodes, wherein the precharge circuit includes a third transistor coupled between the first differential signal node and a first fixed voltage node, a fourth transistor coupled between the second differential signal node and the first fixed voltage node, and a fifth transistor coupled between the first and second differential signal nodes and configured to, when active, equalize a voltage on the first differential signal node to that of the second differential signal node; and
an output circuit configured to, during an enable phase, generate an output signal based on a differential value generated by the keeper;
wherein each of the plurality of latch circuits is configured to operate in the precharge phase responsive to receiving a control signal in a first state, and operate in the enable phase responsive to receiving the control signal in a second state; and
wherein the output circuit comprises first and second cross-coupled NOR gates, a first AND gate having an output coupled to a first input of the first NOR gate and a second AND gate having an output coupled to a first input of the second NOR gate, wherein a first input of the first AND gate is coupled to the first differential signal node, wherein a first input of the second AND gate is coupled to the second differential signal node, and wherein respective second inputs of each of the first and second AND gates are coupled to receive the control signal.

13. The register file as recited in claim 12, wherein, during the enable phase, the keeper of a given latch circuit is configured to generate logic values on the first and second differential signal nodes based on respective logic values present on true and complementary bit lines of a selected one of a subset of bit cells coupled to the corresponding one of the column decoder circuits.

14. The register file as recited in claim 12, wherein each of the plurality of latch circuits is coupled to receive a corresponding control signal and is configured to operate in the precharge phase responsive to the control signal being in a first state and operate in the enable phase responsive to the control signal being in a second state.

15. The register file as recited in claim 12, wherein, in each of the latch circuits, a drain terminal of each of the first and second transistors in are coupled to the second and first differential signal nodes, respectively.

16. The register file as recited in claim 12, wherein each of the latch circuits is implemented without having a corresponding sense amplifier.

\* \* \* \* \*